United States Patent
Lin et al.

(10) Patent No.: US 9,306,584 B2
(45) Date of Patent: Apr. 5, 2016

(54) MULTI-FUNCTION DELAY LOCKED LOOP

(71) Applicant: Cavium, Inc., San Jose, CA (US)

(72) Inventors: David Lin, Westborough, MA (US);
Suresh Balasubramanian, Shrewsbury, MA (US)

(73) Assignee: Cavium, Inc., San Jose, CA (US)

(*) Notice: Subject to any disclaimer, the term of this patent is extended or adjusted under 35 U.S.C. 154(b) by 0 days.

(21) Appl. No.: 14/639,476

(22) Filed: Mar. 5, 2015

(65) Prior Publication Data
US 2015/0188528 A1    Jul. 2, 2015

Related U.S. Application Data

(63) Continuation of application No. 13/370,784, filed on Feb. 10, 2012, now Pat. No. 9,143,140.

(60) Provisional application No. 61/442,944, filed on Feb. 15, 2011.

(51) Int. Cl.
| | |
|---|---|
| *H03L 7/06* | (2006.01) |
| *H03L 7/081* | (2006.01) |
| *H03K 5/135* | (2006.01) |
| *H03K 5/14* | (2014.01) |
| *H03L 7/08* | (2006.01) |

(52) U.S. Cl.
CPC .............. *H03L 7/0816* (2013.01); *H03K 5/135* (2013.01); *H03K 5/14* (2013.01); *H03L 7/08* (2013.01)

(58) Field of Classification Search
None
See application file for complete search history.

(56) References Cited

U.S. PATENT DOCUMENTS

| | | | |
|---|---|---|---|
| 5,930,231 A * | 7/1999 | Miller et al. ................. | 370/210 |
| 6,114,914 A | 9/2000 | Mar | |
| 6,131,168 A * | 10/2000 | Krzyzkowski ................ | 713/503 |
| 6,791,889 B2 | 9/2004 | Peterson | |
| 6,952,462 B2 * | 10/2005 | Harrison ....................... | 375/373 |
| 7,012,985 B1 * | 3/2006 | Nix ................................ | 377/48 |
| 7,103,790 B2 | 9/2006 | Rentschler et al. | |
| 7,157,889 B2 * | 1/2007 | Kernahan et al. ............ | 323/268 |
| 7,276,952 B2 * | 10/2007 | Desai et al. .................. | 327/291 |
| 7,304,897 B2 | 12/2007 | Hong et al. | |
| 7,561,477 B2 | 7/2009 | Morzano et al. | |
| 7,915,938 B2 | 3/2011 | Iozsef et al. | |
| 8,917,129 B1 * | 12/2014 | He et al. ....................... | 327/159 |
| 9,143,140 B2 | 9/2015 | Lin et al. | |
| 2002/0071509 A1 * | 6/2002 | Richards et al. ............. | 375/355 |
| 2003/0053572 A1 * | 3/2003 | Brethour et al. ............. | 375/354 |
| 2005/0285652 A1 * | 12/2005 | Panikkar et al. ............. | 327/231 |
| 2006/0245519 A1 * | 11/2006 | Cheng et al. ................. | 375/316 |
| 2007/0217559 A1 * | 9/2007 | Stott et al. .................... | 375/355 |
| 2009/0059642 A1 | 3/2009 | Ware et al. | |
| 2010/0225369 A1 | 9/2010 | Badaroglu | |
| 2010/0246290 A1 | 9/2010 | MacLaren et al. | |
| 2011/0096613 A1 | 4/2011 | Teramoto | |
| 2011/0148486 A1 * | 6/2011 | Mosalikanti et al. ......... | 327/158 |
| 2012/0206181 A1 * | 8/2012 | Lin et al. ...................... | 327/199 |
| 2012/0319749 A1 | 12/2012 | Thaller et al. | |
| 2013/0033946 A1 * | 2/2013 | Ware et al. ................... | 365/193 |
| 2014/0293710 A1 * | 10/2014 | Ware et al. ................ | 365/189.02 |
| 2015/0098277 A1 | 4/2015 | Lin | |

\* cited by examiner

*Primary Examiner* — Lincoln Donovan
*Assistant Examiner* — Khareem E Almo
(74) *Attorney, Agent, or Firm* — Hamilton, Brook, Smith & Reynolds, P.C.

(57) ABSTRACT

A delay circuit provides a quadrature-delayed strobe, a tightly controlled quadrature DLL and write/read leveling delay lines by using the same physical delay line pair. By multiplexing different usage models, the need for multiple delay lines is significantly reduced to only two delay lines per byte. As a result, the delay circuit provides substantial saving in terms of layout area and power.

10 Claims, 10 Drawing Sheets

MULTI-FUNCTION DELAY LOCKED LOOP

RELATED APPLICATIONS

This application is a continuation of U.S. application Ser. No. 13/370,784, filed Feb. 10, 2012, which claims the benefit of U.S. Provisional Application No. 61/442,944, filed on Feb. 15, 2011. The entire teachings of the above application are incorporated herein by reference.

BACKGROUND

A typical memory controller requires the outgoing data (DQ) from the chip to be a quadrature phase off its data strobe (DQS) and the incoming data and data strobe needs to be offset in a similar way. A quadrature phase is equal to ¼ of a clock period. This is to ensure that the data bits (DQ) are sampled by the data strobe (DQS) in the middle of the data bits to achieve maximum setup and hold time margin. This is typically done either by using (1) a multi-phase (typically 4 phases) PLL embedded inside each data byte or (2) by using a master DLL which is periodically calibrated to generate the quadrature setting which is then conveyed to replica delay lines that are present in each byte.

In addition, due to the fly-by topology adopted by DRAM modules in DDR3, CK, commands and addresses of each SDRAM on a given DIMM card have different arrival times. The memory controller, therefore, must compensate the fly-by delay by implementing adjustable delay lines on DQS and DQ such that DQS can be aligned with its corresponding CK at any given byte. This procedure is called write leveling. Similarly for the incoming data, the memory controller also needs to stall data of different bytes with different delays so eventually all bytes can arrive at the same time with respect to the internal CK used by the memory controller; and this is called read leveling.

SUMMARY

Embodiments of the present invention provide a quadrature-delayed strobe, a tightly controlled quadrature DLL and write/read leveling delay lines by using the same physical delay line pair. By multiplexing different usage models, the need for multiple delay lines is significantly reduced to only two delay lines per byte. As a result, embodiments provide substantial saving in terms of layout area and power.

In one aspect, a delay circuit comprises a delay line configured to receive a clock signal and output a delayed clock signal; a delay controller configured to control the delay line to output the delayed clock signal at a quadrature delay relative to the clock signal; a multiplexer receiving a plurality of delay signals, the delay signals including the clock signal and the delayed clock signals; and a state machine configured to control the multiplexer to select one of the delay signals to provide signal leveling among a plurality of associated output signals.

The delay signals may further include complements of the clock signal and the delayed clock signal. The delay circuit may further include a second delay line configured to receive a data strobe signal and output a delayed data strobe signal.

In an embodiment, the state machine may be further configured to control the multiplexer to select one of the delay signals to enable the data strobe signal at the second delay line.

In an embodiment, the delay line and the second delay line may be coupled during an idle period of the memory interface, the delay controller adjusting the quadrature delay of at least one of the delay line and the second delay line during the idle period.

In an embodiment, the delay controller may further include at least two offset adders and subtractors, each of the offset adders and subtractors associated with a respective one of the delay line and the second delay line, the offset adders and subtractors being adjustable via a signal external to the delay circuit. The at least two adders and subtractors may be configured to generate an offset to the quadrature delay.

In another aspect, an interface circuit comprises a plurality of blocks, each block receiving a clock signal and a respective outbound data signal, each block comprising a delay line configured to receive the clock signal and output a delayed clock signal; a delay controller configured to control the delay line to output the delayed clock signal at a quadrature delay relative to the clock signal; a multiplexer receiving a plurality of delay signals, the delay signals including the clock signal and the delayed clock signals; and at least one flip-flop configured to receive the respective outbound data signal, the at least one flip-flop being clocked by the multiplexer output. The interface circuit further includes a state machine configured to control the multiplexer at each of the blocks to select a delay signal to provide signal leveling among the respective outbound data signals.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
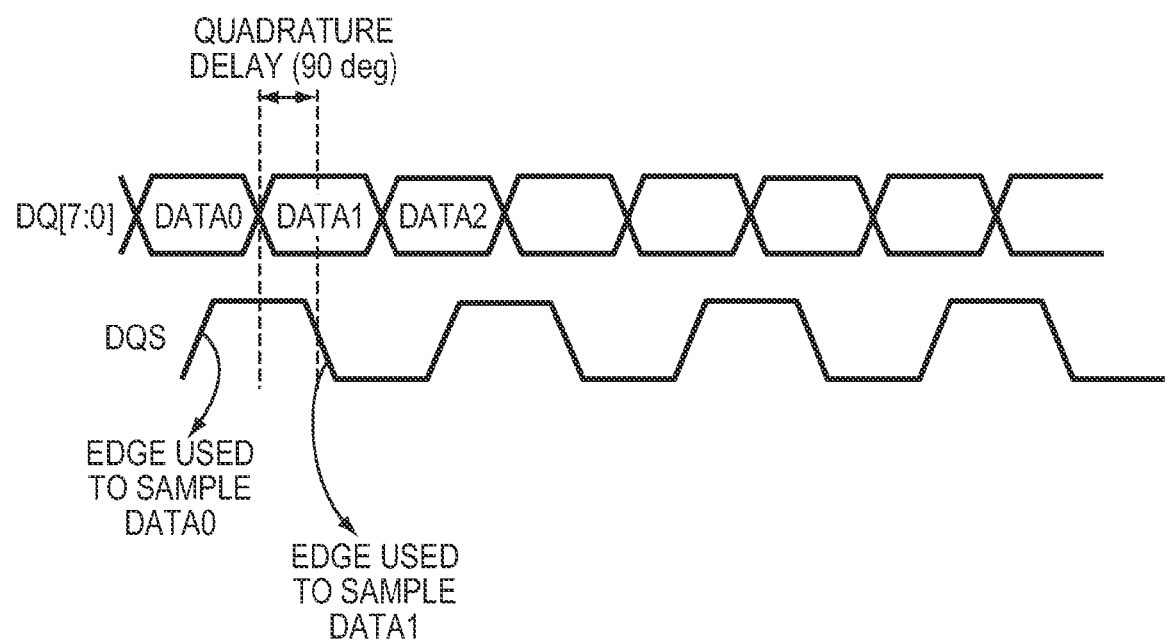
FIG. 1 is a signal diagram of a data signal and corresponding data strobe.

In a typical SDRAM design, each data byte (8 bits of data) is associated with a dedicated data strobe (DQS). The data bits (DQ) and DQS are bidirectional buses that are driven by the memory controller during a memory write and driven by the memory during a memory read. During a memory write, it is required that the memory controller outputs a DQS and DQ bits to be center-aligned, i.e. ¼ clock period off each other (also known as a quadrature cycle). During a memory read, the memory sends back DQS and DQ edge aligned, and the controller then needs to delay the incoming DQS to be a ¼ clock period off the incoming DQ bits. The DQS signal is used to sample the data bits (DQ[7:0]) by the memory during a write and by the memory controller during a read. The waveforms of DQ and DQS after the quadrature phase shift are shown in FIG. 1.

Figure 2A:
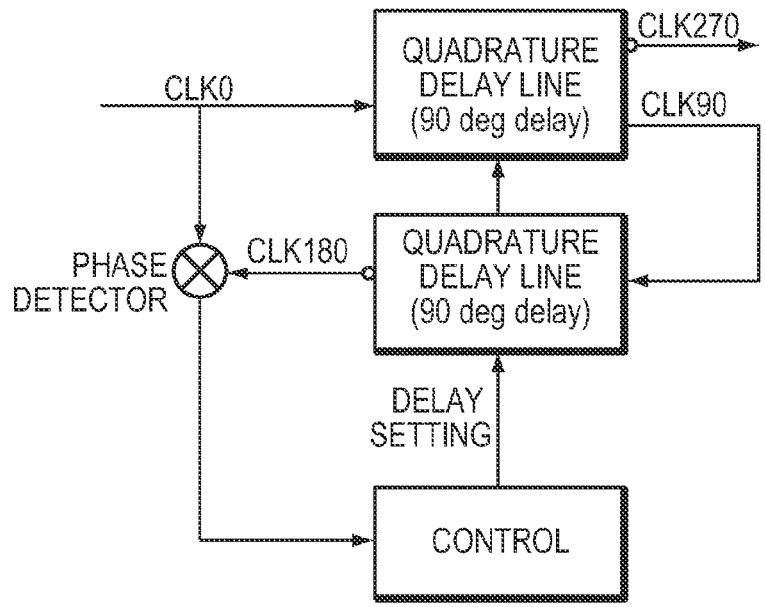
FIG. 2(a) is a block diagram of a quadrature DLL.
Figure 2B:
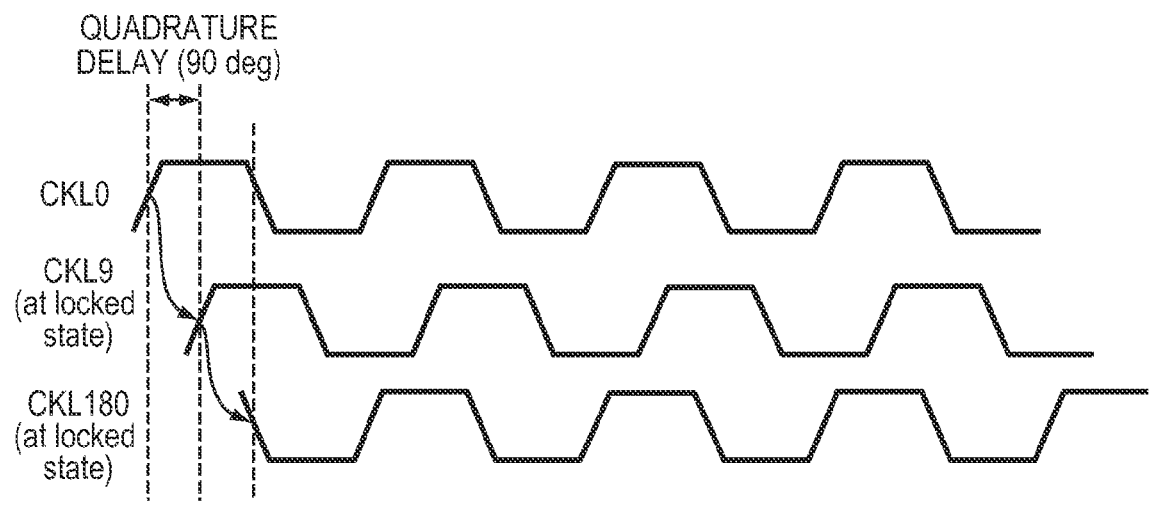
FIG. 2(b) is a signal diagram of inputs and outputs of a quadrature DLL.

Quadrature DLL. A quadrature DLL is used to generate a delay equivalent to ¼ of the clock period (90 degrees) from a given input clock. This is typically achieved using two delay lines, a bang-bang phase detector and a FSM controller. Upon deassertion of reset, the controller initializes the delay lines at their minimum setting. Thereafter, the controller continually increments the setting of both the delay lines until CLK180's rising edge crosses the rising edge of CLK0. At this stage the quadrature DLL is considered locked and CLK90 is delayed from CLK0 by ¼ clock period. The block diagram of the quadrature DLL is shown in FIG. 2(*a*) and the locking waveforms are shown in FIG. 2(*b*).

Figure 3:
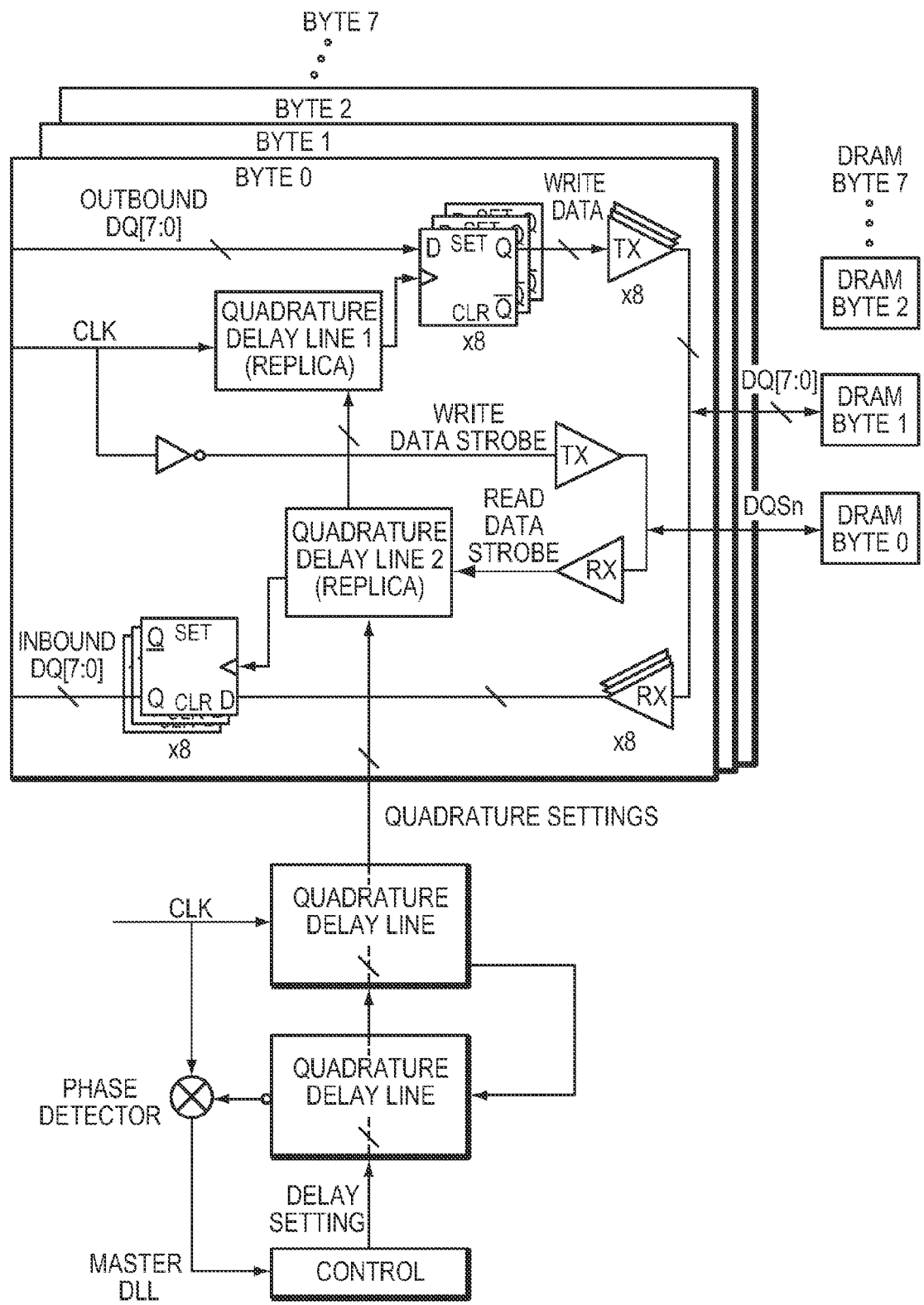
FIG. 3 is a circuit diagram of a replica-based quadrature DLL.

A typical double data rate memory controller interface uses a master DLL to generate the quadrature setting which is in turn relayed to all the data bytes in the interface. The master DLL is locked to a delay equal to half the nominal clock period during the initialization of the memory interface. Since the setting for the two delay lines are identical, each delay line has a nominal delay equal to ¼ the clock period (quadrature) when the DLL is in the locked state. Each byte has a delay line on the outbound path to delay the outgoing data bits (DQ) during a write. The byte also contains another delay line on the inbound path to delay the incoming DQS during a read. Both these open loop delay lines use the quadrature setting generated by the master DLL. This functionality is shown pictorially in FIG. 3.

Figure 4:
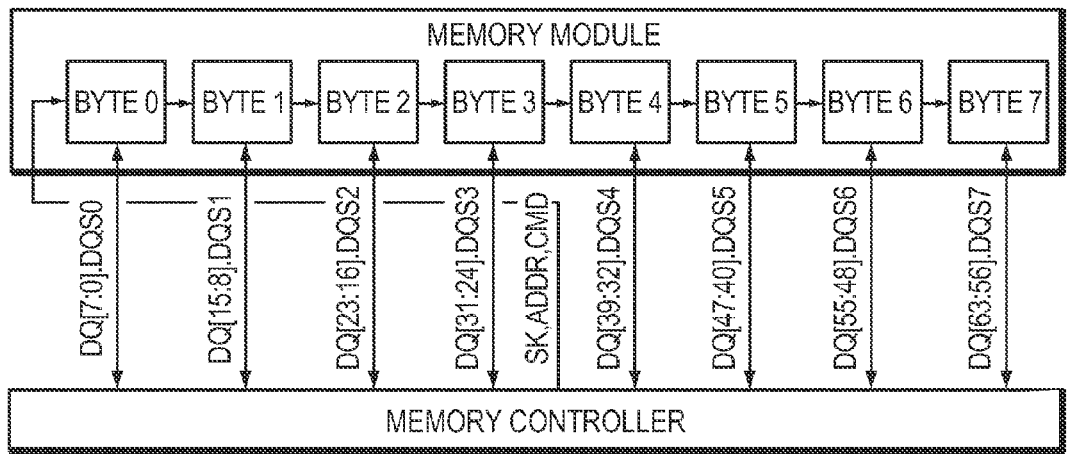
FIG. 4 is a block diagram of a memory interface.

Write and Read Leveling. The system routing of the CK, Addresses, Commands, DQ and DQS signals in a DDR3 interface is shown in FIG. 4. An example of a DDR3 unbuffered SDRAM module is used in this case. Due to the fly-by topology adopted by SDRAM modules, it can be clearly seen from this diagram that the CK, ADDR & CMD pins arrive at BYTE7 much later compared to BYTE0 while the DQ and DQS pins have nominally matched routing delays between the memory controller and the memory module. However, the DDR3 specification requires that the skew between the arrival time of CK and DQS at any byte to be within ¼ clock period. This implies that the DQS7 be delayed from DQS0 by the same amount as the trace delay of CK from BYTE0 to BYTE7. This deskewing mechanism needs to be implemented by the memory controller in order to meet timing specification at the SDRAM. During a memory write, that means DQ group of BYTE(n+1) needs to have additional delay compared to the one of BYTE(n). The ultimate goal is to push out the edge of DQS to be within ¼ clock period of the edge of CK for any byte lane. This is called write leveling. Similarly, during a memory read, DQ group of BYTE(n) is launched earlier than DQ group of BYTE(n+1) from the SDRAMs due to early clocking, the memory controller needs to stall the incoming DQ group of BYTE(n) longer than that of BYTE(n+1). After adding different delays for different byte lanes, eventually the memory controller makes them all arrive at the same time. This procedure is commonly known as read leveling.

Figure 5:
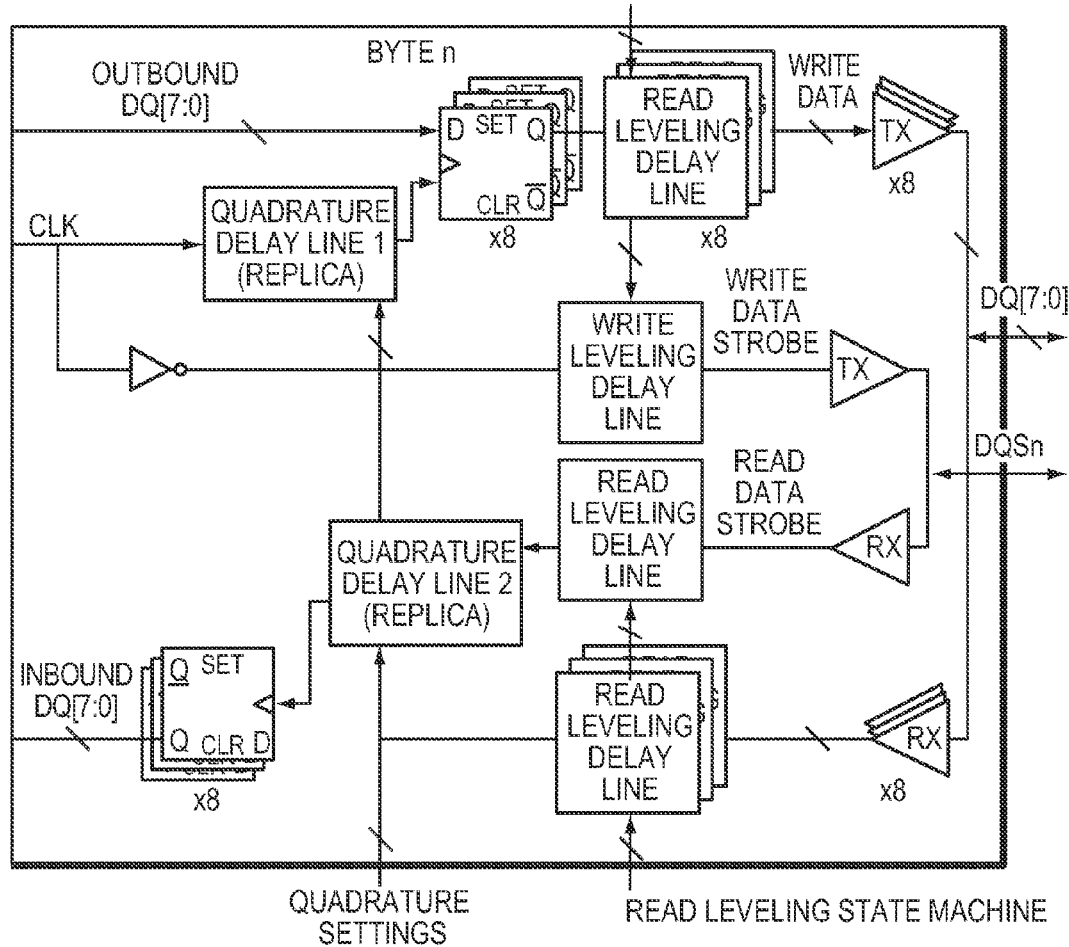
FIG. 5 is a circuit diagram of a memory interface implementing write and read leveling with additional open loop delay lines.

The read and write leveling functionality is typically implemented in most memory controllers by adding a separate open loop delay line to each data bit and data strobe within a byte as shown in FIG. 5. The delay setting for all the open loop delay lines within a byte can be identical. Different bytes may have different settings for the open loop delay lines that are adjusted to compensate for the different arrival times of the CK, CMD & ADDR pins of the memory interface at each byte. The settings for these open loop delay lines are controlled either through hardware and/or software state machine which implements the concept of write and read leveling as outlined in JEDEC JESD79-3x DDR3 SDRAM specification.

Embodiments of the present invention provide a quadrature-delayed strobe, a tightly controlled quadrature DLL and write/read leveling delay lines by using the same physical delay line pair. By multiplexing different usage models, the need for multiple delay lines is significantly reduced to only two delay lines per byte. Example embodiments include a circuit employing a single pair of delay lines per data byte and providing (a) a tightly controlled quadrature setting with an option to optimize setup and hold time margin on DQS vs. DQ bus; (b) adjusting DQS and DQ to be a quadrature apart; and (c) write and read leveling.

Figure 6:
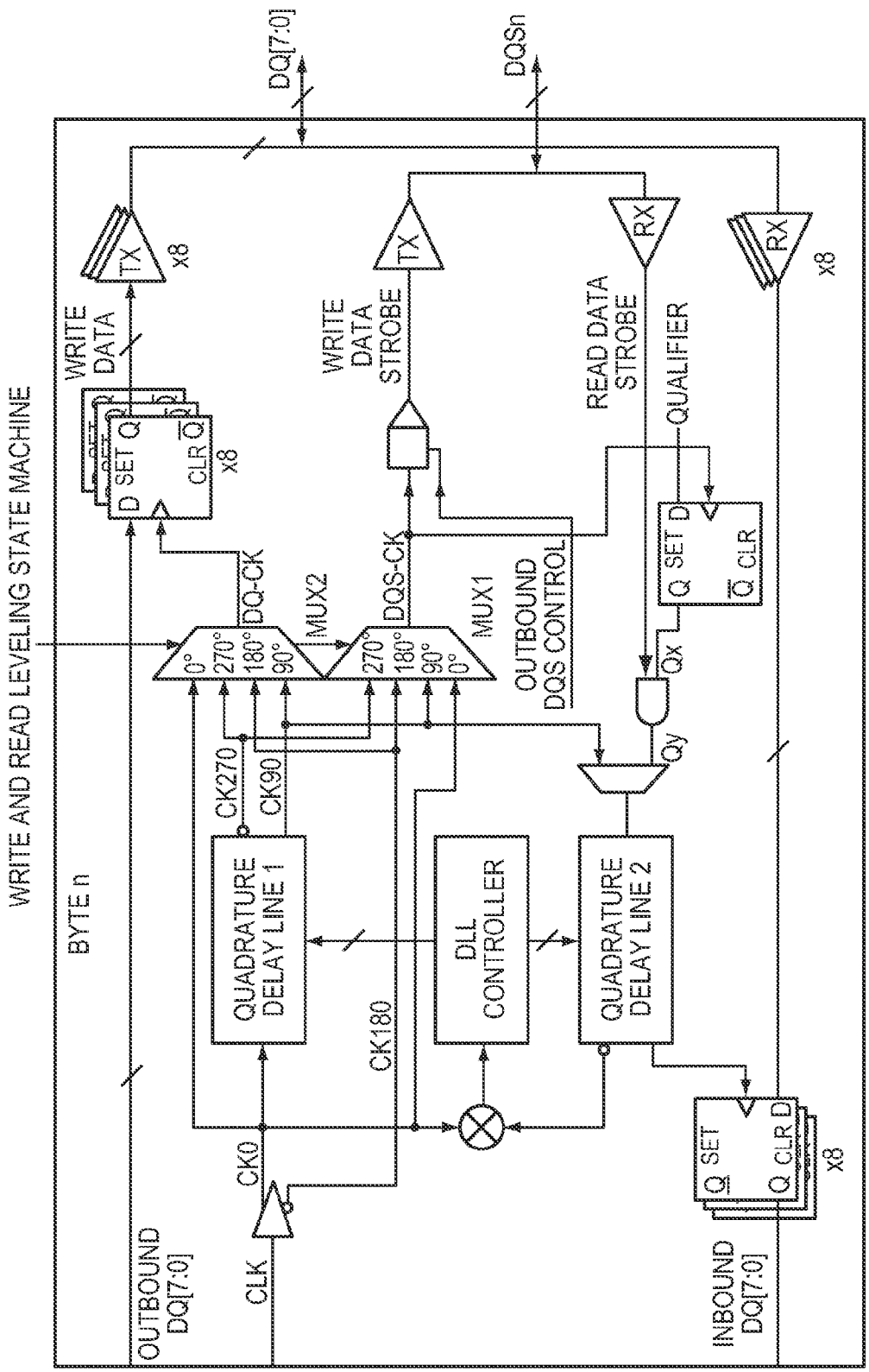
FIG. 6 is a circuit diagram of a digital delay line of an embodiment of the present invention.
Figure 7:
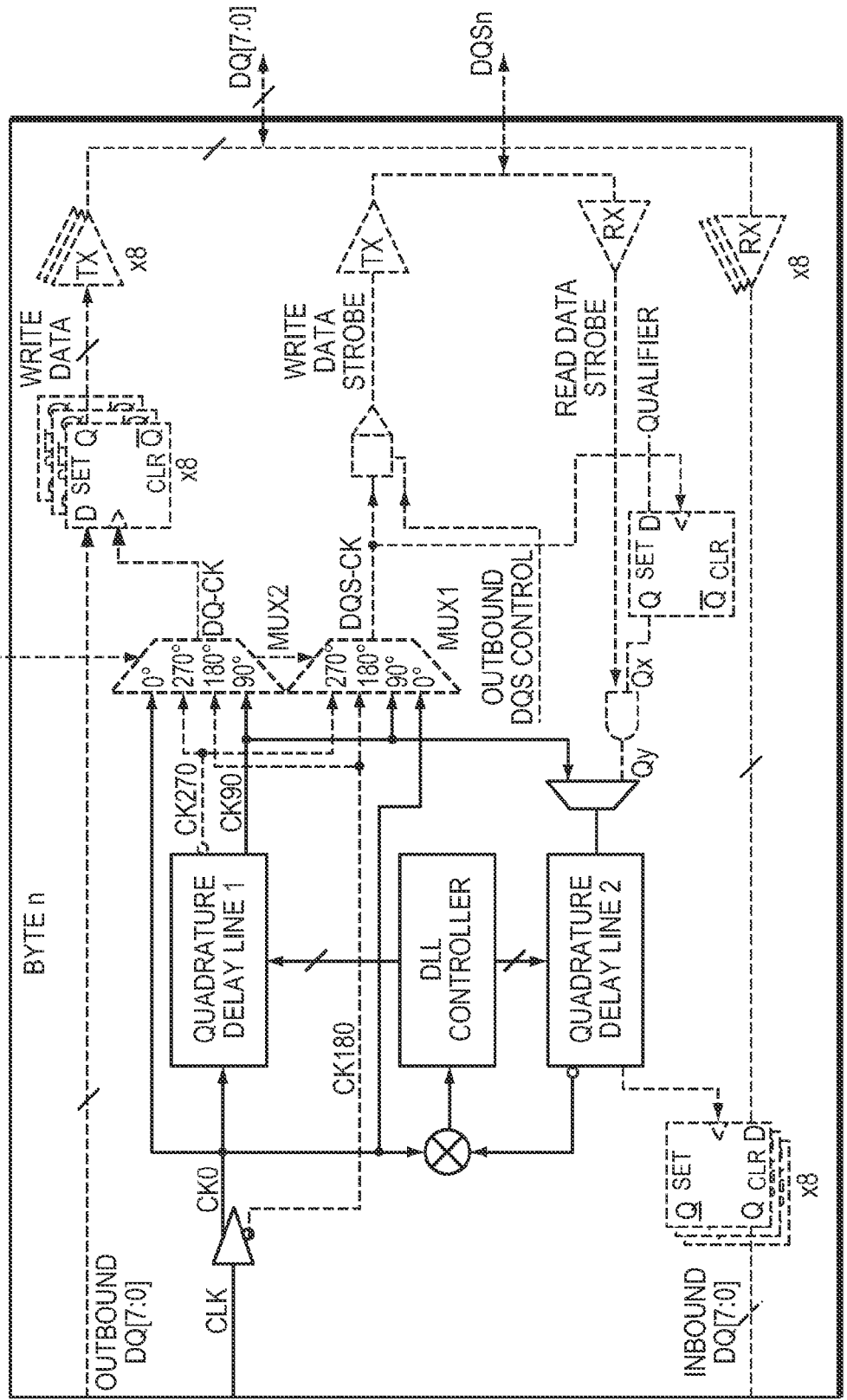
FIG. 7 is a circuit diagram of a digital delay line as shown in FIG. 6, highlighted to show circuit operation under DLL mode.

FIG. 6 is a circuit diagram of a digital delay line in an example embodiment of the present invention. During the initialization of the memory interface, the two delay lines are coupled together to generate a precise quadrature setting. And during the idle periods of the memory interface, the delay lines are again coupled together to update the quadrature setting to account for temporal variations in voltage and temperature. The setting is then stored by the DLL controller for later use in the open-loop mode. The circuit components that are involved in the generation of the quadrature setting are highlighted in FIG. 7, which illustrates the same digital delay line shown in FIG. 6, with the exception that the components not involved in the generation of the quadrature setting are obscured.

Figure 8A:
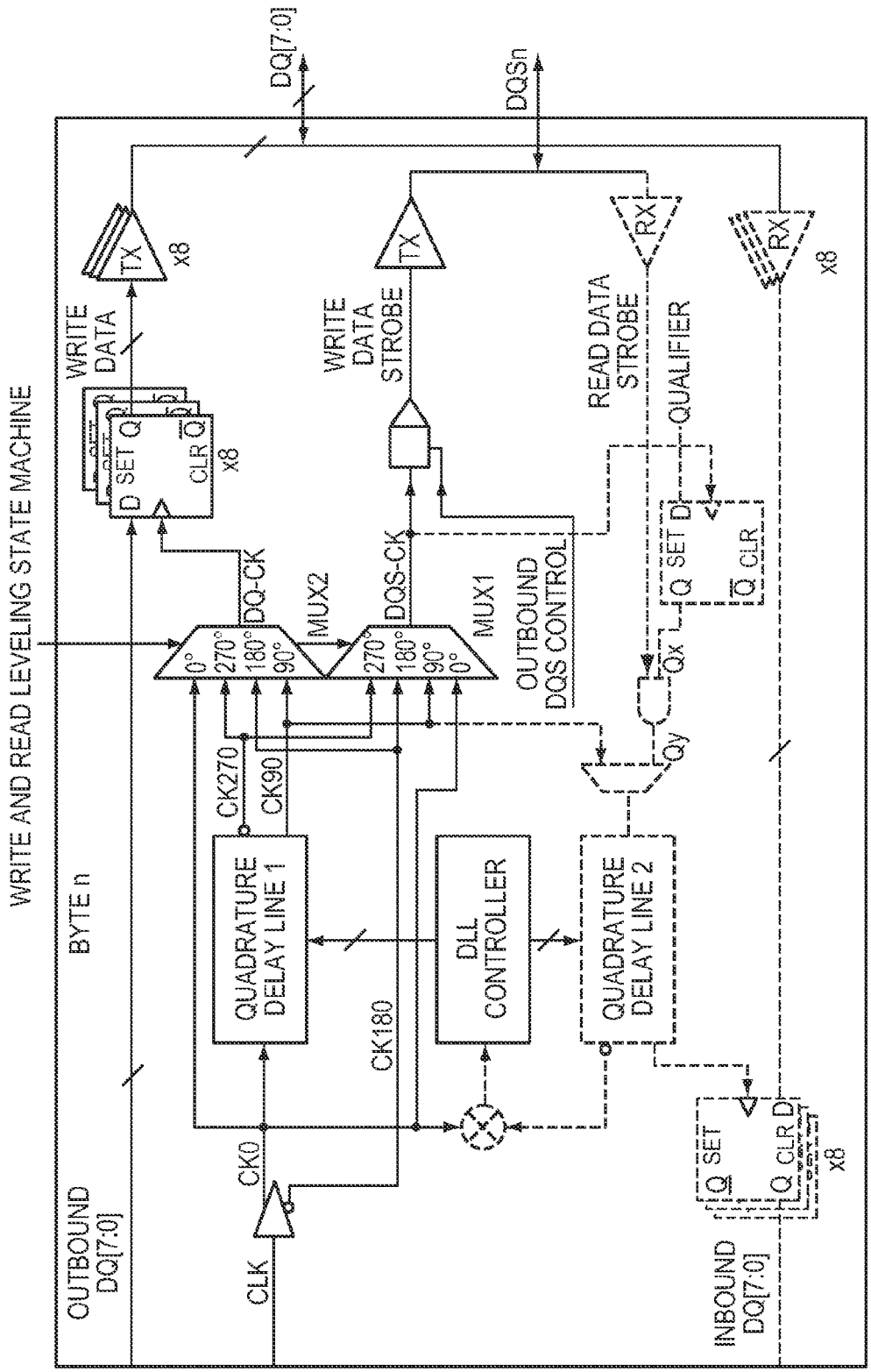
FIG. 8(a) is a circuit diagram of a digital delay line as shown in FIG. 6, highlighted to show circuit operation of a write transaction, with write leveling capability.
Figure 8B:
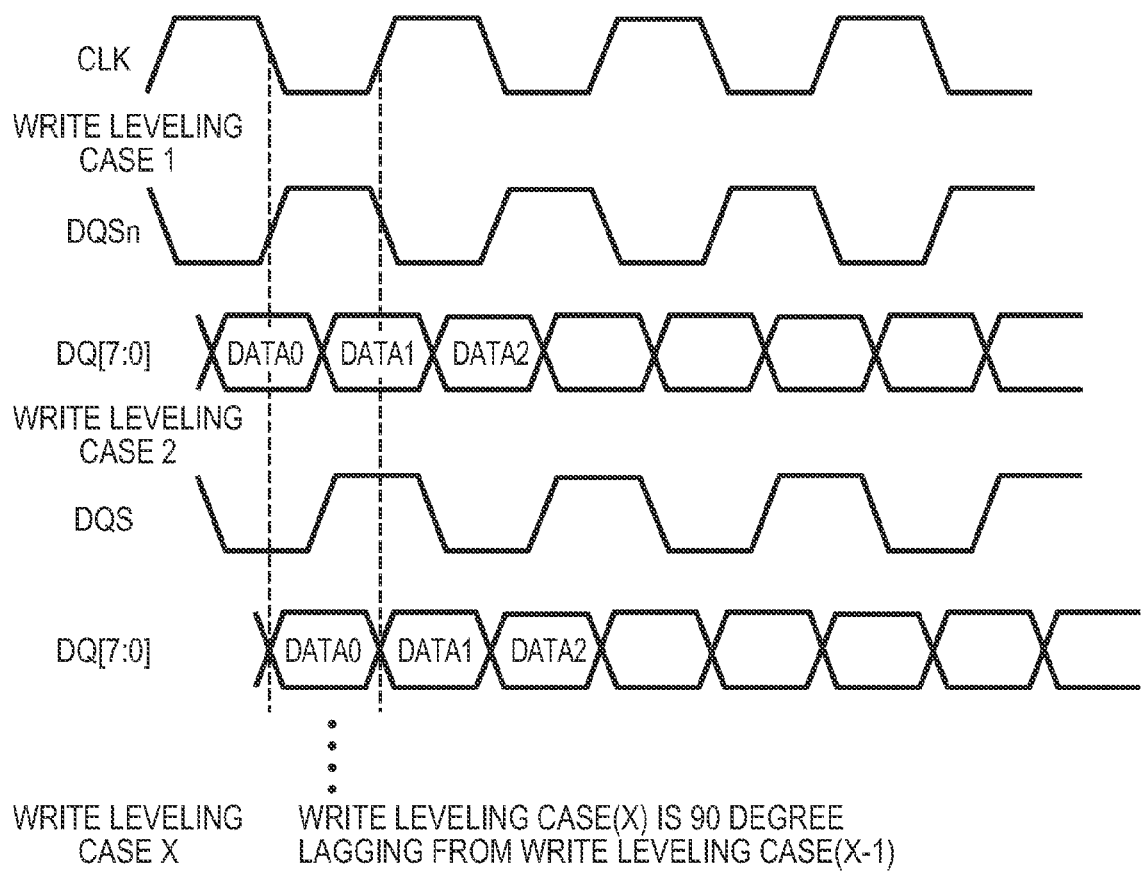
FIG. 8(b) is a signal diagram of corresponding signals of the digital delay line of FIG. 6 during write leveling.

In the open-loop mode, these delay lines serve to appropriately delay the DQS and DQ bits such that not only DQS can transition at the middle of the eye of the DQ bits, but also DQS and its DQ bits can be leveled together at a 90° increment. Circuits components that are involved in a memory write are highlighted in FIG. 8(*a*). When a write transaction happens without the need for write leveling, DQS and its DQ bits still need to be a quadrature apart from each other before leaving the memory controller. This can be done by choosing MUX1 with 0° and MUX2 with 90°. And when write leveling is required, MUX1 and MUX2 can be adjusted accordingly so that DQ_CLK, shown in FIG. 8(*a*), is always lagging DQS_CLK by 90° regardless which input of MUX1 is used. In addition, if one or more cycles of write leveling delay are required for DQS and DQ, the write leveling state machine can delay the issue of outbound DQS and DQ appropriately. The delay on DQS is achieved by using the OUTBOUND DQS Control signal, and the delay on DQ is postponed by OUTBOUND DQ[7:0] issued from the memory controller, as shown in FIG. 8(*a*). At least one flip-flop is configured to receive the respective outbound data signal, the at least one flip-flop being clocked by the multiplexer output. End results of different cases of write leveling settings are shown in FIG. 8(*b*) as an example. Each case is a 90° increment from a previous case, namely, each DQ group can be pushed out by a ¼ cycle granularity before leaving the memory controller.

Figure 9A:
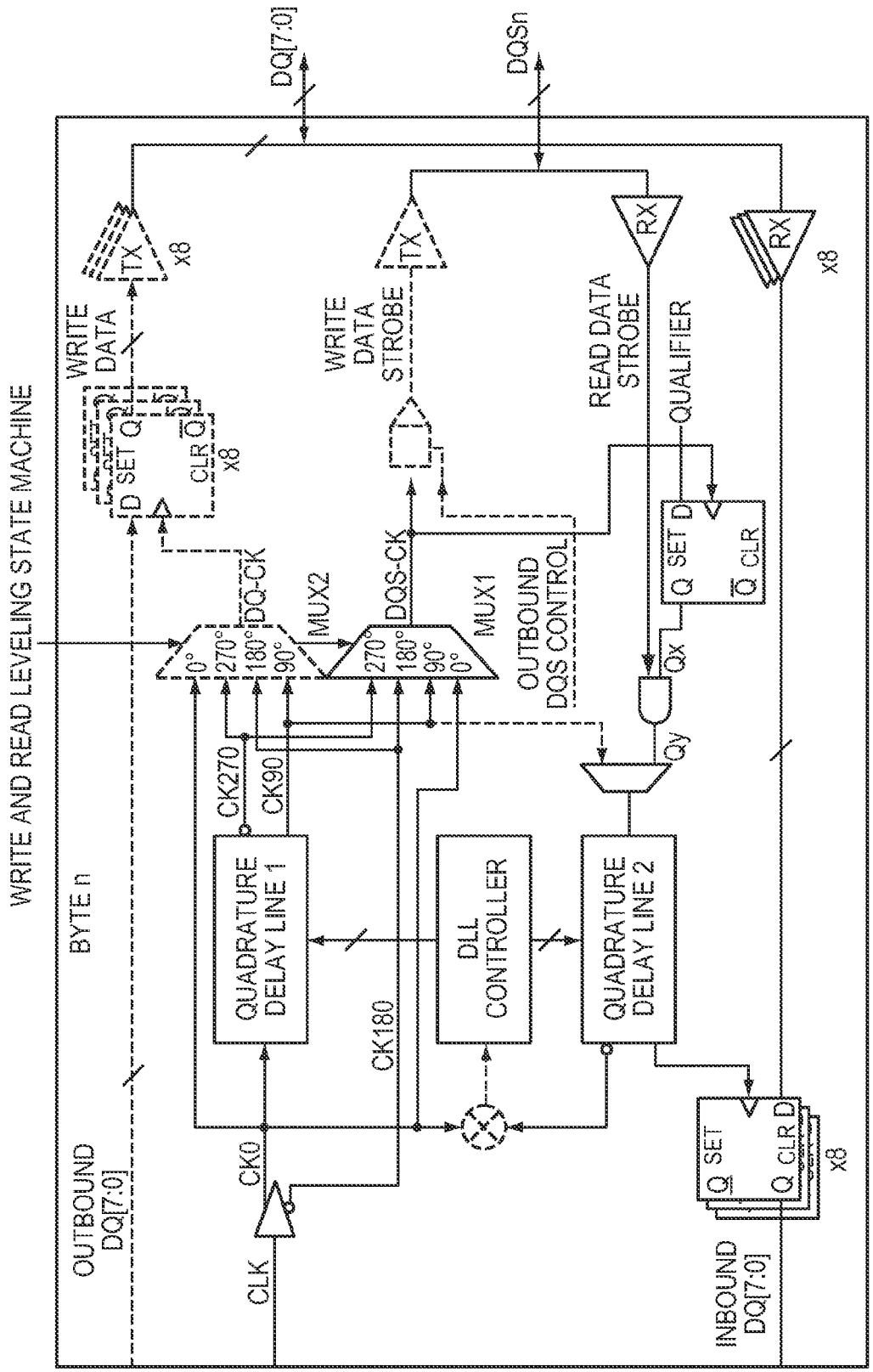
FIG. 9(a) is a circuit diagram of a digital delay line as shown in FIG. 6, highlighted to show circuit operation of a read transaction, with read leveling capability.
Figure 9B:
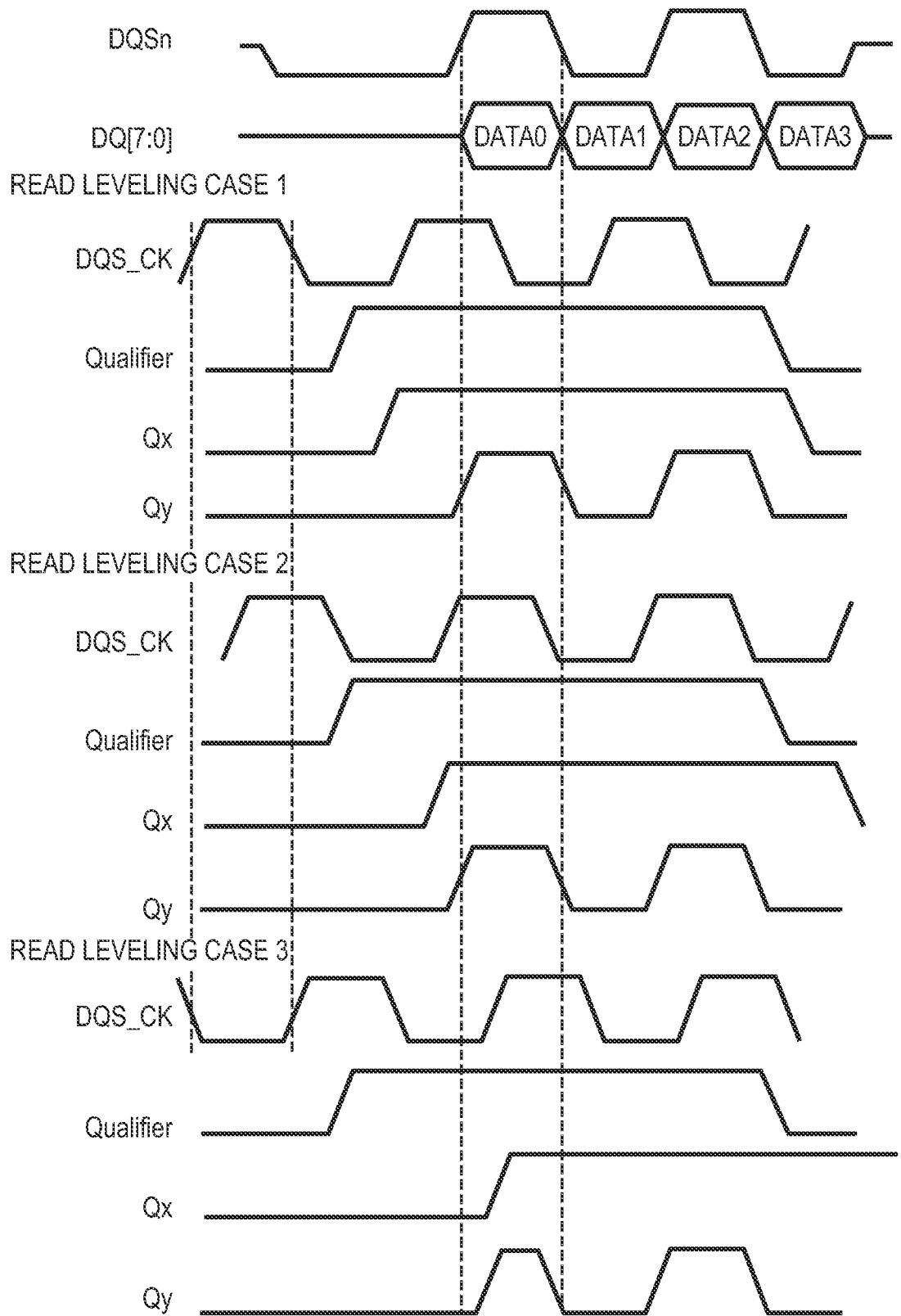
FIG. 9(b) is a timing diagram of corresponding signals of the digital delay line of FIG. 6 during read leveling.

Circuits components involved in the memory read transaction are highlighted in FIG. 9(a). The incoming DQS and its DQ bits need to be 90° apart from each other regardless of whether read leveling is needed or not. This can be guaranteed by incoming DQS always passing through QUADRATURE DELAY LINE 2 and then using it as a clock to qualify its incoming DQ bits. And when read leveling is required at a granularity of less than one cycle, MUX1 can be selected at a 90° increment accordingly. In addition, if one or more cycles of read leveling delay are needed, the read leveling state machine can further delay the Qualifier at a cycle-based increment. Different cases of read leveling settings are shown in FIG. 9(b) as an example. DQS_CK in conjunction with Qualifier, shown in FIG. 9(a), are used to qualify the incoming DQSn signal. Two cycles of DQSn is used in this scenario, and the goal is to capture these two cycles of DQSn and DQ[7:0] irrespective to the skew difference between DQS_CK vs. DQSn. Case 1 and Case 2 shown in FIG. 9(b) demonstrate that these two read leveling cases are capable of achieving the goal mentioned above, while case 3 shows that first cycle of DQSn and DQ[7:0] may be lost resulting in a failed case.

In addition, either during memory write or read transaction, nominally DQS and its DQ bits need to be maintained a quadrature apart from each other. However, due to mismatch on the board routing, DQS and DQ bits may end up to be with a certain offset away from the ideal 90°. In a memory write, for example, while DQS and DQ leave the pins of the memory controller with an ideal 90° alignment, they may have deviated from it when reaching the memory pins if board traces on DQS vs. DQ bits are not matched perfectly. To compensate for this systematic mismatch, the DLL controller in example embodiments has an option to adjust the quadrature setting such that the DQS and its DQ bits at the memory pins can be tuned back to an ideal 90° alignment for better timing. A similar mechanism is also used during memory read transaction to optimize for setup and hold time margin at the memory controller.

In order to provide the aforementioned feature, the DLL controller is built with two independent offset adder/subtractors (one for each quadrature delay line) that can be adjusted at the system level. Initially the DLL controller comes up a quadrature setting in a close-loop mode. Subsequently when the memory controller performs memory write or read transaction, which are the open-loop mode, the memory controller may choose to use the adder/subtractors to do an offset on top of the existing quadrature setting before it leaves the DLL controller. By iterating through the offset adjustment one setting at a time followed by a memory transaction, the optimized amount of offset can be obtained at the system level through combining the pass/fail window data generated at the different offset settings. With this design, setup and hold time margin in either direction, i.e. read and write, can be easily optimized, thereby improving the DDR frequency performance. This is extremely important for a state of the art memory controller to meet the multi-GHz DDR frequencies specified in DDR3 and future DDR4 standard.

Embodiments of the present invention provide a multi-function quadrature-delayed strobe, a tightly controlled quadrature DLL and write/read leveling delay lines by using the same physical delay line pair. Some of the advantages of the example embodiments include:
1. Reduced area due to the reuse of the same delay line for all the different purposes outlined earlier instead of using separate delay lines.
2. Reduced power due to the lower switching cap (lesser number of transistors) in this approach.
3. Reduced susceptibility to process variation by locating the DLL within each byte unlike the traditional replica DLL approach.
4. Minimized drift from the ideal quadrature setting by having a periodic update mechanism.
5. Ability to fine tune the quadrature setting at the system level to meet the demands of multi-GHz DDR design.

Although embodiments of the invention described above may be implemented in applications of DDR3 SDRAM protocol, embodiments may also be configured for applications in DDR3L, DDR3U, DDR, DDR2, DDR4, LPDDR2, LPDDR3, GDDR2, GDDR3, GDDR4, GDDR5, WIDE IO, and other memory protocols.

While this invention has been particularly shown and described with references to example embodiments thereof, it will be understood by those skilled in the art that various changes in form and details may be made therein without departing from the scope of the invention encompassed by the appended claims.

What is claimed is:
1. A delay circuit comprising:
a delay line configured to receive a clock signal and output a delayed clock signal;
a delay controller configured to control the delay line to output the delayed clock signal at a quadrature delay relative to the clock signal;
a multiplexer receiving a plurality of delay signals, the delay signals including the clock signal and the delayed clock signals; and
a state machine configured to control the multiplexer to select one of the delay signals to provide write leveling among a plurality of associated output signals.
2. The delay circuit of claim 1, wherein the delay signals further include complements of the clock signal and the delayed clock signal.
3. The delay circuit of claim 1, further comprising a second delay line configured to receive a data strobe signal and output a delayed data strobe signal.
4. The delay circuit of claim 3, wherein the state machine is further configured to control the multiplexer to select one of the delay signals to enable the data strobe signal at the second delay line.
5. The delay circuit of claim 3, wherein the delay line and the second delay line are coupled during an idle period of the memory interface, the delay controller adjusting the quadrature delay of at least one of the delay line and the second delay line during the idle period.
6. The delay circuit of claim 3, wherein the delay controller further includes at least two offset adders and subtractors, each of the offset adders and subtractors associated with a respective one of the delay line and the second delay line, the offset adders and subtractors being adjustable via a signal external to the delay circuit.
7. The delay circuit of claim 6, wherein the at least two adders and subtractors are configured to generate an offset to the quadrature delay.
8. An interface circuit comprising:
a plurality of blocks, each block receiving a clock signal and a respective outbound data signal, each block comprising:
a delay line configured to receive the clock signal and output a delayed clock signal;
a delay controller configured to control the delay line to output the delayed clock signal at a quadrature delay relative to the clock signal;

a multiplexer receiving a plurality of delay signals, the delay signals including the clock signal and the delayed clock signals;

at least one flip-flop configured to receive the respective outbound data signal, the at least one flip-flop being clocked by the multiplexer output; and a state machine configured to control the multiplexer at each of the blocks to select a delay signal to provide signal leveling among the respective outbound data signals.

9. The interface circuit of claim 8, wherein the state machine is further configured to control the multiplexer to select one of the delay signals to provide read leveling among a plurality of associated input signals.

10. The delay circuit of claim 1, wherein the state machine is further configured to control the multiplexer to select one of the delay signals to provide read leveling among a plurality of associated input signals.

\* \* \* \* \*